United States Patent [19]

Kiyono

[11] Patent Number: 5,506,802
[45] Date of Patent: Apr. 9, 1996

[54] STATIC RANDOM ACCESS MEMORY DEVICE HAVING HIGH SOFT ERROR IMMUNITY

[75] Inventor: Junji Kiyono, Tokyo, Japan

[73] Assignee: NEC Corporation, Tokyo, Japan

[21] Appl. No.: 358,945

[22] Filed: Dec. 19, 1994

[30] Foreign Application Priority Data

Dec. 17, 1993 [JP] Japan .................................. 5-317982

[51] Int. Cl.⁶ .................................................. G11C 11/00
[52] U.S. Cl. ........................ 365/156; 365/154; 257/903
[58] Field of Search ...................... 365/154, 156; 257/903

[56] References Cited

U.S. PATENT DOCUMENTS 5,281,843  1/1994  Ochii ........................ 365/154
5,298,764  3/1994  Yamanaka ................... 257/903

FOREIGN PATENT DOCUMENTS 2-14566   1/1990  Japan .
4-162473  6/1992  Japan .
4-59783   9/1992  Japan .

Primary Examiner—David C. Nelms
Assistant Examiner—A. Zarabian
Attorney, Agent, or Firm—Popham, Haik, Schnobrich & Kaufman

[57] ABSTRACT

An SRAM having a TFT load element has a gate electrode of the load TFTs disposed between bit lines and channel regions of the load TFTs. The structure avoids formation of a parasitic transistor in which each of the bit lines would act as a gate electrode for the channel region of the TFT load element. The SRAM has a high soft error immunity even at a low supply voltage.

5 Claims, 6 Drawing Sheets

STATIC RANDOM ACCESS MEMORY DEVICE HAVING HIGH SOFT ERROR IMMUNITY

BACKGROUND OF THE INVENTION (a) Field of the Invention

The present invention relates to a static random access memory (SRAM) device having a high soft error immunity and, more particularly, to an SRAM having excellent operation at Low supply voltage and a high soft error immunity through employing a new structure of a thin film transistor (TFT) load element;.

(b) Description of the Related Art

A conventional SRAM device having a TFT lead element is described, for example, in Publication Nos. JP-A-92-59783 and 92-162473. A memory cell structure of the SRAM device described in JP-A-92-162473 will be described below with reference to FIG. 1.

A memory cell of an SRAM generally has a flip-flop circuit formed by six transistors, namely, two drive transistors, two access transistors and two load TFTs. In FIG. 1, a gate electrode 24 of a load TFT is located under a channel region 25c of the lead TFT. Such an arrangement is called a "bottom gate type".

An access transistor is composed of heavily doped N-type source/drain regions 22a and 22b formed by diffusion in P-well region 31 located in an N-type semiconductor substrate 30 and a gate electrode 23a formed by a first polycrystalline silicon layer. A gate electrode 23c of each drive transistor is also formed by the first polycrystalline silicon layer. In FIG. 1, each of the gate electrode 24, source/drain electrodes 25a and 25b and a channel region 25c of the load TFT is located above the gate electrode 23c of the drive transistor with an intervention of an oxide layer. The gate electrode 24 of the load TFT is formed by a second polycrystalline silicon layer while the drain electrode 25a, the source electrode 25b and the channel region 25c are formed by a third polycrystalline silicon layer. The drain 22a of the access transistor is connected through a polycrystalline silicon pad 26 and a first metallic interconnection layer 27 to a bit line 28 formed by a second metallic interconnection layer.

SUMMARY OF THE INVENTION

It is an object of tile present invention to provide an SRAM having a TFT load element which exhibits an excellent operation at a low supply voltage and has an excellent soft error immunity.

A static random access memory device according to the present invention comprises: a substrate; a pair of bit lines formed overlying tile substrate; and a plurality of memory cells operatively coupled to the pair of bit lines, each of the memory cells having a pair of memory nodes for storing a data, a pair of access transistors for connecting the pair of memory nodes to the pair of bit lines, a pair of drive transistors for driving the pair of memory nodes in accordance with a signal transmitted through the access transistors, and a pair of load transistors disposed correspondingly to the pair of drive transistors and each including a thin film channel region overlying the substrate and a gate electrode for controlling current of the channel region, the gate electrode being disposed between the channel region and corresponding one of the pair of bit lines.

Preferably, in the SRAM according to the present invention, a ground layer and the gate electrodes of the load transistors are located between the channel regions of the load transistors and the bit lines connected to the access transistors. It is also preferable that the channels the load transistors are formed by a thin film layer of polycrystalline silicon.

Furthermore, when thin film transistors having channels formed by a thin film layer of polycrystalline silicon is employed as tile load transistors, the chip area of the memory cell can be made smaller and the operation thereof can be made more reliable.

BRIEF DESCRIPTION OF THE DRAWINGS

The above and other objects, features arid advantages of the present invention will be more apparent from the following description, referring to accompanying drawings in which.

DESCRIPTION OF THE PREFERRED EMBODIMENTS

Before describing embodiments of the present invention, problems and disadvantages encountered by the conventional memory device will be described for a better understanding the present invention.

In the memory cell of the conventional SRAM having a TFT load element of the bottom gate structure as described before, the channel region 25c of the load TFT is not shielded by any of the electrode layers from the bit line 28. In such a structure, there exist parasitic transistors for which the bit line 28 acts as gate electrodes, additionally to the load TFTs designed to act as load elements of the SRAM. As a result, both electric potentials of the bit line 28 and of the gate electrode 24 act on the channel region 25c of the load TFT thereby effecting ON/OFF operation of the load TFT.

For example, a writing operation of a data into the memory cell requires that one of the designed load TFTs (the first load TFT) which is in an OFF state and connected to one of the cell nodes maintained at a low level before the writing operation should be turned on, thereby raising the drain potential of corresponding load TFT to a high level.

On the other hand, the parasitic load transistor which has the same channel region as the first load TFT shifts to an "OFF" state when the electric potential of the bit line 28 is raised to an "H" level As a result it is likely to occur that the channel of the first load TFT is not conductive, which causes a problem that the cell node subjected to the write-in operation cannot be raised up to a potential level of the supply voltage in a designed period time. This malfunction occurs particularly when the SRAM operates at a low supply voltage. If it takes a large amount of time to charge the cell node and if alpha particles enter the memory cell at this instant, a soft error will arise to destroy the data to be stored in the memory cell. Hence, the soft error immunity of the SRAM deteriorates.

Figure 1:
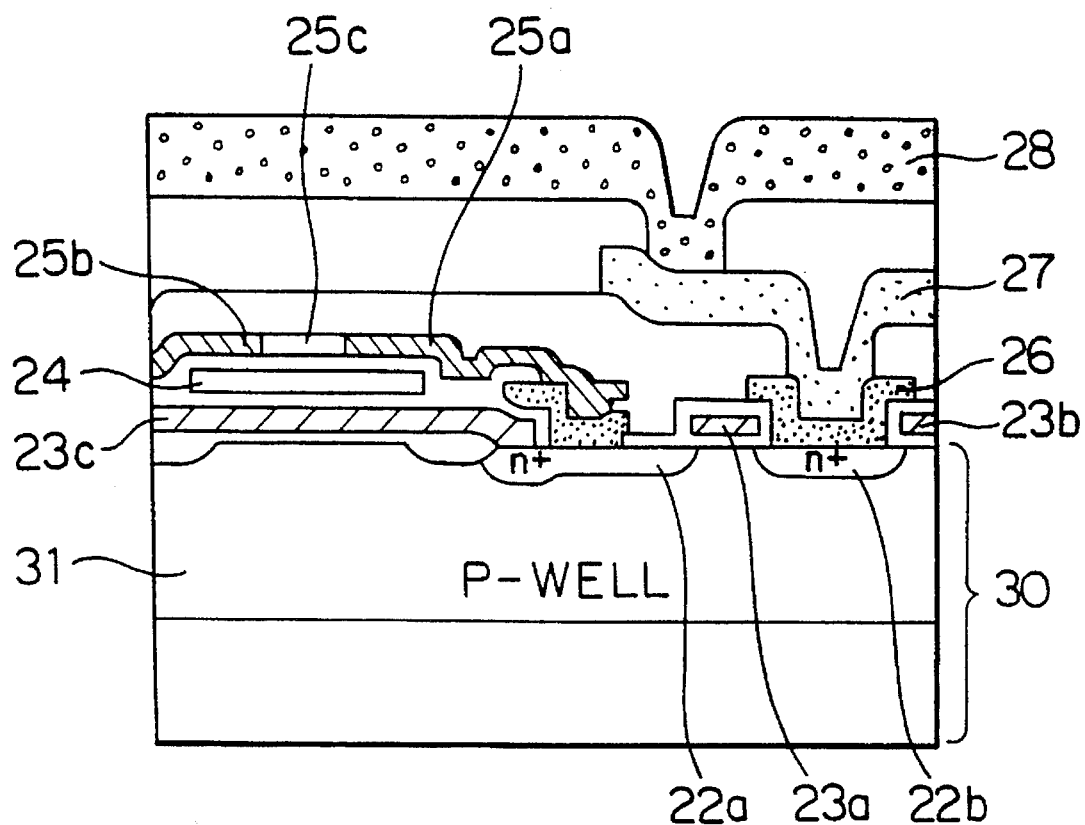
FIG. 1 is a cross-sectional view of a main part in a memory cell of a conventional SRAM having a TFT load element.
Figure 2:
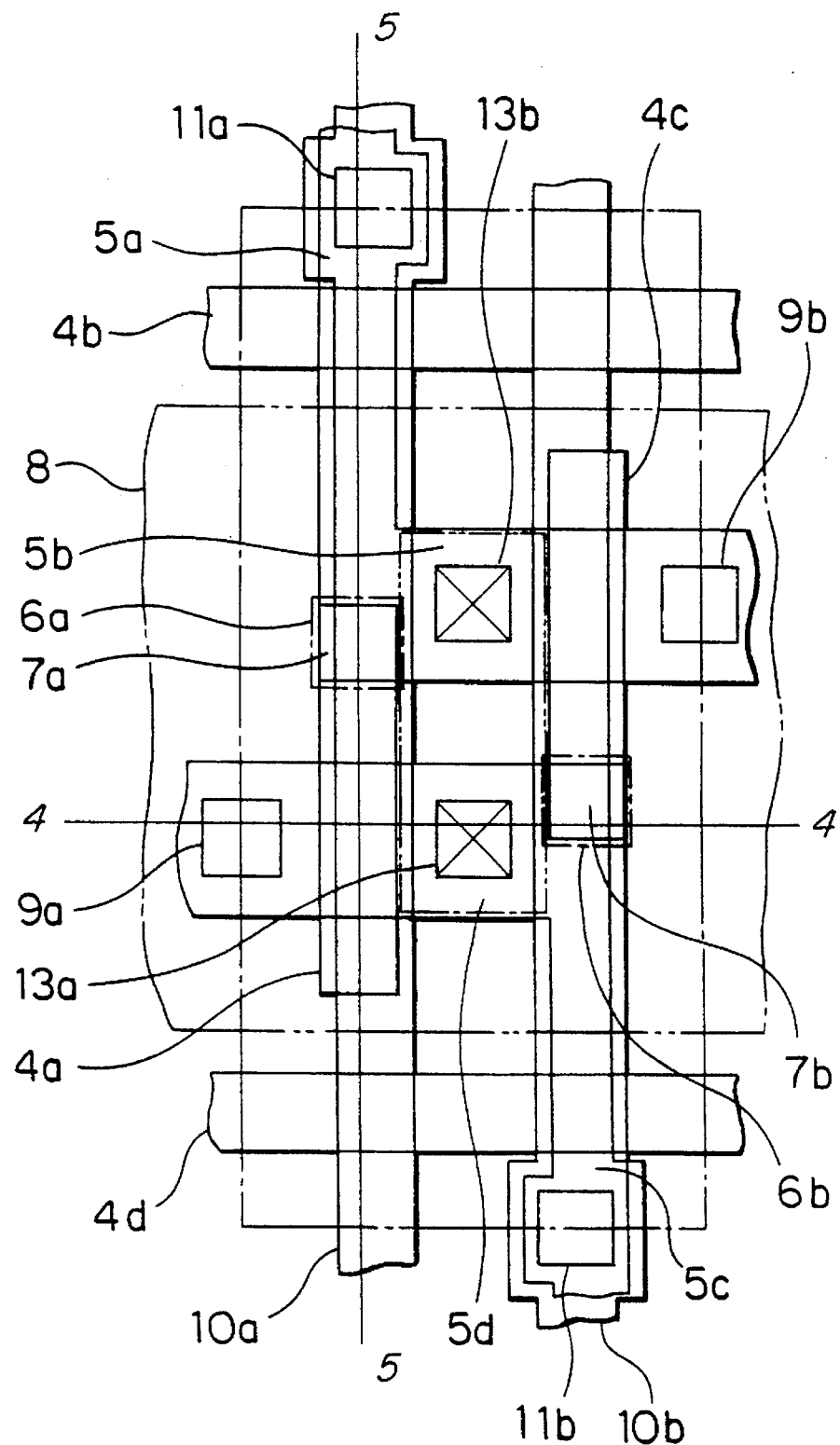
FIG. 2 is a plan view showing the structure of TFT load elements in an SRAM according to a first embodiment of the present invention.
Figure 3:
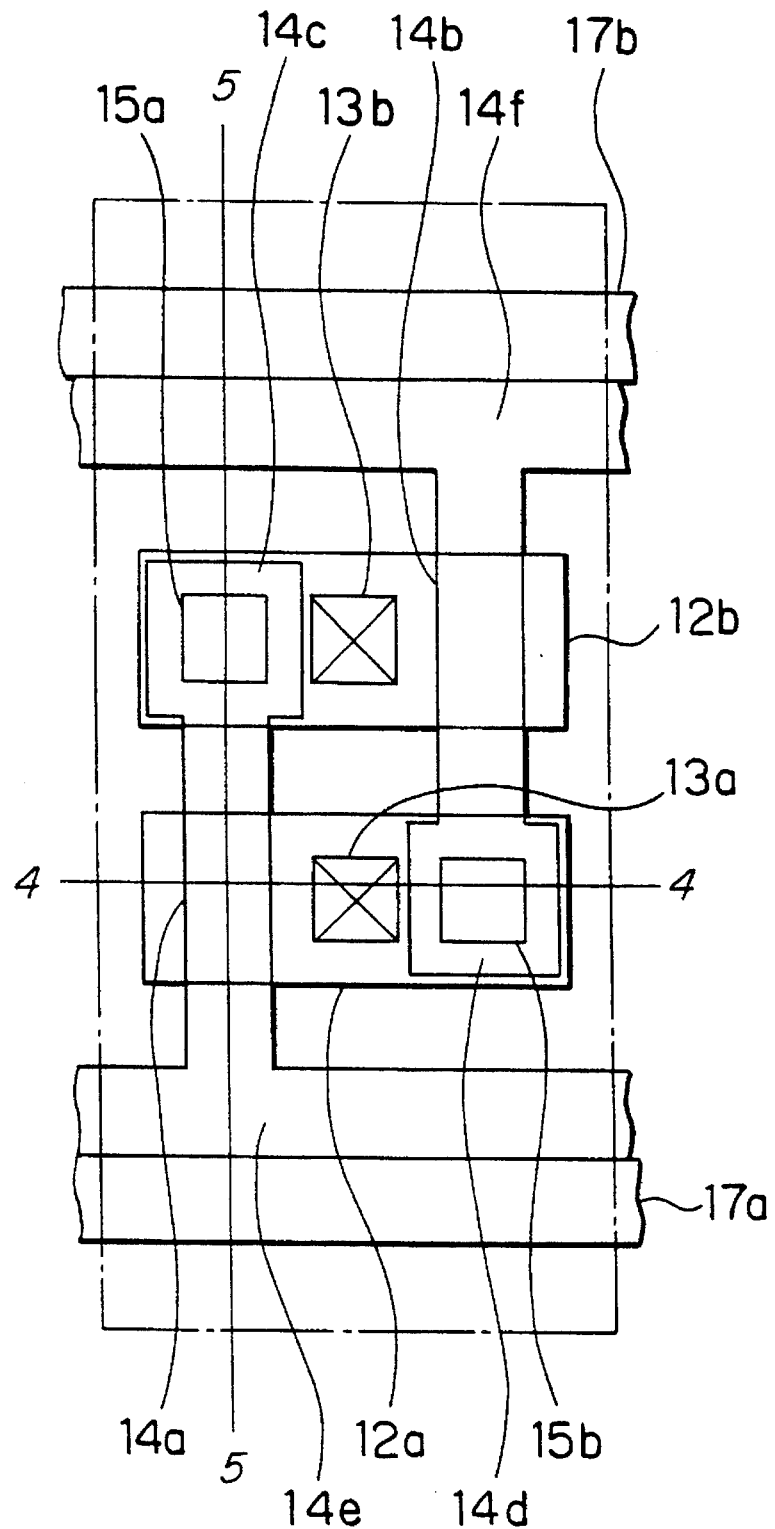
FIG. 3 is a plan view showing the structure of a lower-layer of the TFT load elements shown in FIG. 2.
Figure 4:
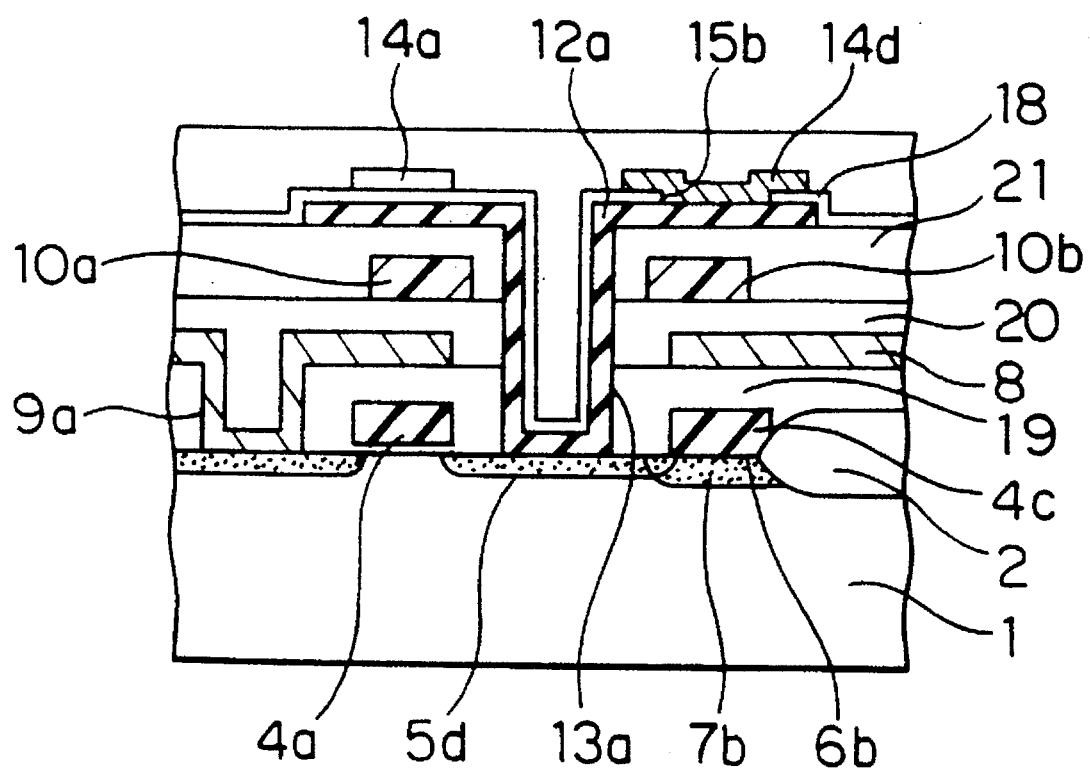
FIG. 4 is a cross-sectional view taken along line 4—4 of FIGS. 2 and 3.
Figure 5:
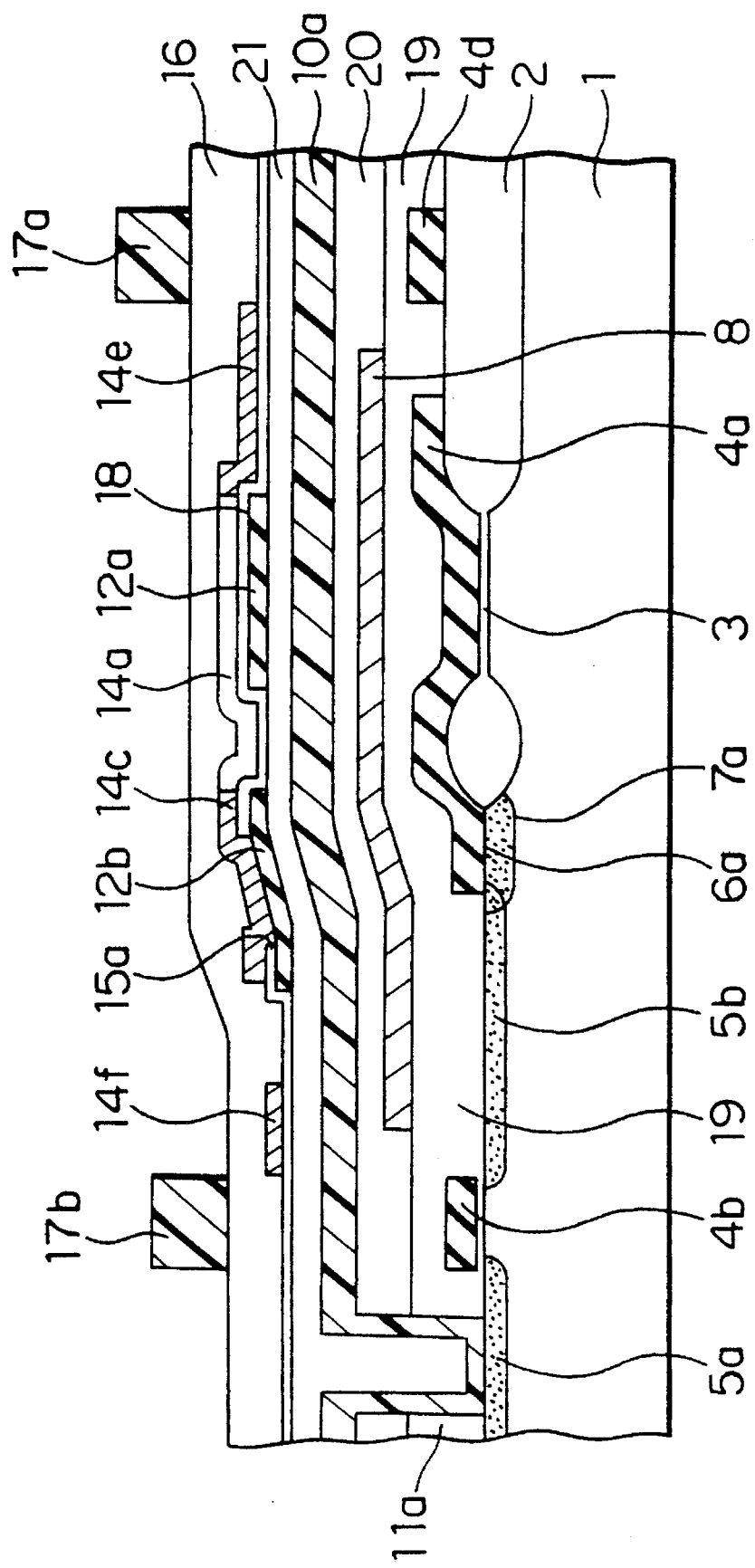
FIG. 5 is a cross-sectional view taken along line 4—4 of FIGS. 2 and 3.

Now, the present invention will be described in detail with reference to the drawings. Referring to FIGS. 2 through there is shown the structure of an SRAM according to a first embodiment of the present invention.

In FIGS. 2 through 5, a field oxide film 2 and a gate oxide film 3 are formed on a main surface of a P-type semiconductor substrate 1 while gate electrodes 4a, 4b, 4c and 4d of N-channel MOSFETs are formed thereon. With those gate electrodes 4a, 4b, 4c and 4d being used as a diffusion mask, drain regions 5a and 5c as well as source regions 5b and 5d of N-channel MOSFETs are formed in a self-aligned manner. The gate electrodes 4a and 4c serve as the gate electrodes of drive transistors in the memory cell. The gate electrodes 4b and 4d serve as tire gate electrodes of access transistors and word lines.

The source regions 5b and 5d of the NMOSFETs constitute respective cell nodes and are connected to the gate electrodes 4a and 4c of the drive transistors through N-type doped regions 7a and 7b constituting the bottom surfaces of the first contact-holes (via-holes served for a first level-interconnections, which will be referred to as "via-holes" hereinafter) 6a and 6b.

A ground layer 8 made of a metal silicide is formed on an insulating film 19 covering the gate electrodes 4a, 4b, and 4d. The ground layer 8 is connected to the source regions 5b and 5d of the drive transistors through second level via-holes 9a and 9b. On the ground layer 8 is formed an insulating film 20, on which bit lines 10a and 10b are further formed. The bit lines 10a and 10b are made of a metal silicide and connected to the drain regions 5a and 5c of respective access transistors.

TFTs operating as load transistors are composed of a gate electrode layer, a gate insulating film 18 and a channel layer consecutively formed on an insulating film 21 covering the bit lines 10a and 10b. Gate electrodes 12a and 12b of the load TFTs are macie of a polycrystalline silicon film doped with an N-type dopant. The gate electrodes 12a and 12b are connected to the source regions 5b and 5d of the drive transistors through fourth level via-holes 13a and 13b, respectively. The source regions 5b and 5d constitute cell nodes.

The active layer of TFTs is made of a polycrystalline silicon film having a large grain size and comprises channel regions 14a and 14b, drain regions 14c and 14d and source regions 14e and 14f. To form the polycrystalline silicon film having a large grain size, an amorphous silicon film is deposited overlying the semiconductor substrate 1 by a low pressure (LP) CVD technology, following which the substrate is annealed for a specified period of time in a nitrogen atmosphere at a low temperature.

The drain regions 14c and 14d of the lead TFTs are connected to the cell node constituted by the source regions 5b and 5d of the drive transistors through fifth level via-holes 15a and 15b and through the gate electrodes 12b and 12a of the load TFTs, respectively. Furthermore, aluminum interconnections 17a and 17b are formed on an interlayer insulating film 16 and connected to the gate electrodes (word lines) 4a and 4b of the drive transistors through unillustrated sixth via-holes, thereby reducing parasitic resistances or the word lines 4a and 4b for a higher speed operation of the memory cell.

According to the present embodiment, the gate electrodes 12a and 12b of the lead TFTs are located between the bit lines 10a and 10b and the channel regions 14a and 14b of the lead TFTs. Hence, the channels 14a and 14b of the lead TFTs are less likely to be ill-affected by electric potentials of the bit lines 10a and 10b. In other words, the formation of parasitic transistors in which the bit lines act as gate electrodes for the channel of the load TFTs can be avoided. Accordingly, electric potentials of the bit lines do not adversely affect the operations of the load TFTs.

Figure 6:
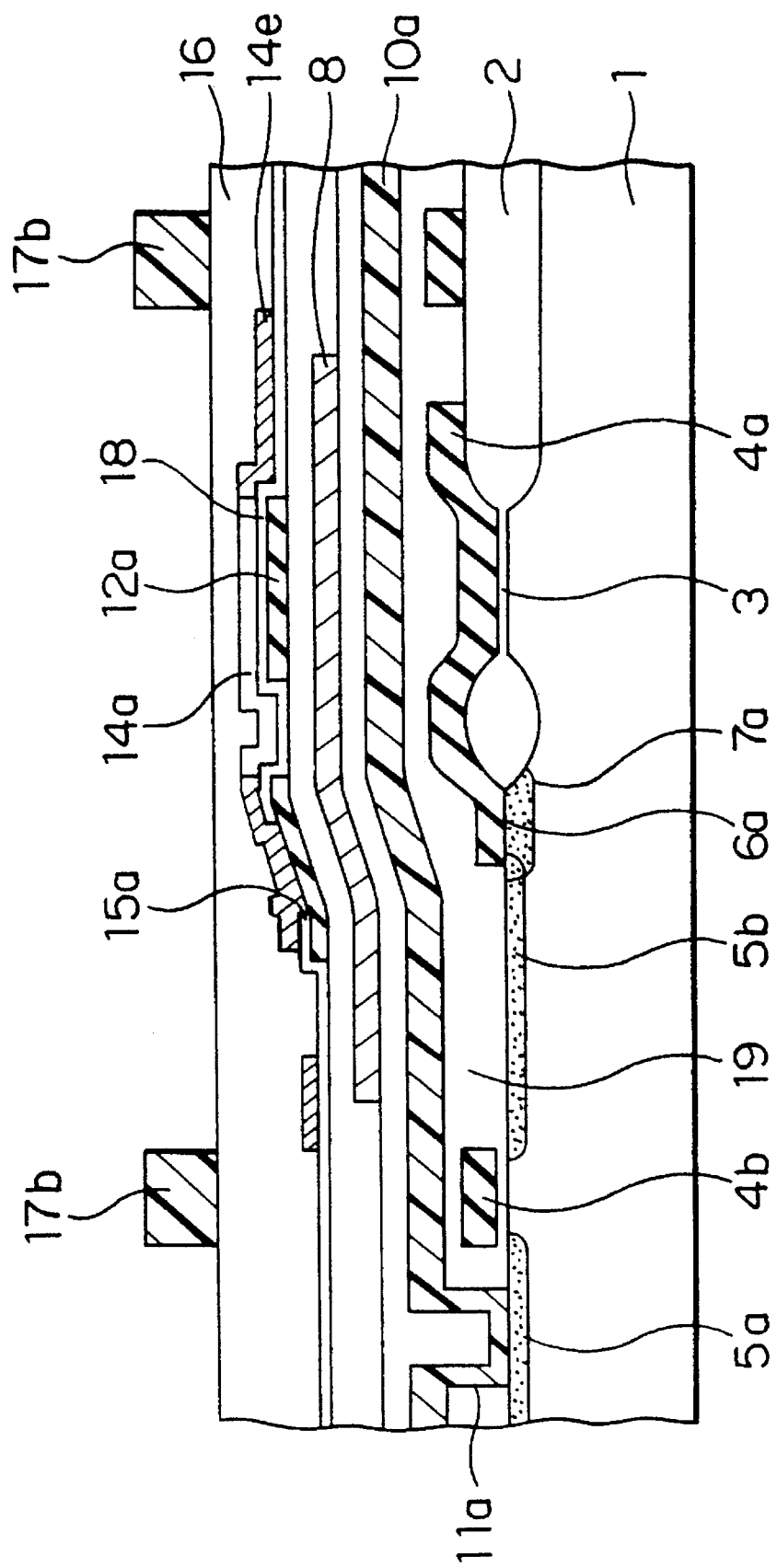
FIG. 6 is a cross-sectional view showing an SRAM according to a second embodiment of the present invention.

Now, an SRAM according to a second embodiment of the present invention will be described. FIG. 6 is a cross-sectional view showing a memory cell structure of the SRAM formed in a semiconductor IC device according to the second embodiment of the present invention.

The second embodiment is different from the first embodiment in arrangement of bit lines 10a and 10b and the ground layer 8. In detail, in the present embodiment shown in FIG. 6, the ground layer 8 is formed above the bit lines 10a and 10b while, in the first embodiment in FIG. 5, the bit lines 10a and 10b are formed above the ground layer 8. In other words, each of the gate electrodes 12a and 12b of the load TFTs and the ground layer 8 are located in the present embodiment in the midst between corresponding one of the bit lines 10a and 10b and corresponding one of the channel regions 14a and 14b of the load TFTs.

According to the arrangement of the second embodiment, the channel regions 14a and 14b of the load TFTs are more effectively shielded by the ground layer 8 located underneath, thereby reducing influence induced by the potential of the bit lines 10a and 10. Although, in first and second embodiments, TFT load elements are formed by a polycrystalline semiconductor layer, the present invention is not limited thereto. The load transistors may be formed by a single-crystalline semiconductor layer or a two-or-more laminated layer comprising single-crystalline and polycrystalline line semiconductor layers.

Although the present invention is described with reference to the preferred embodiments, the present invention is not Limited to such embodiments and it will be obvious for those skilled in the art that various modifications or alterations can be easily made based on the above embodiments within the scope of the present invention.

What is claimed is:

1. A static random access memory device comprising:

a) a substrate;

b) a pair of bit lines formed overlying said substrate; and c) a plurality of memory cells operatively coupled to said pair of bit lines, wherein each of said memory cells includes:

c1) a pair of memory nodes for storing a data, c2) a pair of access transistors for connecting said pair of memory nodes to said pair of bit lines, c3) a pair of drive transistors for driving said pair of memory nodes in accordance with a signal transmitted through said access transistors, and c4) a pair of load transistors disposed correspondingly to said pair of drive transistors and overlying said bit lines, wherein each of said load transistors includes:

a thin film channel region overlying said substrate, and a gate electrode for controlling current of said channel region, said gate electrode being disposed between said channel region and a corresponding one of said pair of bit lines.

2. A static random access memory device as defined in claim 1 wherein each of said memory cells has a ground layer connected to corresponding one of said drive transistors and disposed between corresponding said channel region and corresponding one of said pair of bit lines.

3. A static random access memory device as defined in claim 1 wherein said channel region is formed by a polycrystalline silicon film.

4. A static random access memory as defined in claim 1 wherein each of said drive transistors and said access transistors has a channel region within said substrate.

5. A static random access memory as defined in claim 1 wherein each of said pair of load transistors is a p-channel field effect transistor.

* * * * *